(12) United States Patent  
Avila et al.

(10) Patent No.: US 8,886,877 B1
(45) Date of Patent: Nov. 11, 2014

(54) IN-SITU BLOCK FOLDING FOR NONVOLATILE MEMORY

(71) Applicant: SanDisk Technologies Inc., Plano, TX (US)

(72) Inventors: Chris Avila, Saratoga, CA (US); Gautam Dusija, Milpitas, CA (US); Deepak Raghu, Milpitas, CA (US); Cynthia Hsu, Fremont, CA (US); Changyuan Chen, San Ramon, CA (US); Farookh Moogat, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/278,747

(22) Filed: May 15, 2014

(51) Int. Cl.
*G06F 12/06* (2006.01)
*G06F 3/06* (2006.01)
*G06F 12/02* (2006.01)

(52) U.S. Cl.
CPC ............ *G06F 3/0679* (2013.01); *G06F 3/0629* (2013.01); *G06F 3/0619* (2013.01); *G06F 2212/7208* (2013.01); *G06F 2212/1024* (2013.01); *G06F 2212/214* (2013.01); *G06F 12/0638* (2013.01); *G06F 12/0246* (2013.01)
USPC .................... 711/103; 711/165; 711/E12.008

(58) Field of Classification Search
CPC . G06F 12/0246; G06F 12/06; G06F 12/0638; G06F 2212/1024; G06F 2212/214
USPC .................................... 711/103, 165, E12.008
See application file for complete search history.

(56) References Cited

U.S. PATENT DOCUMENTS

| | | | |
|---|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |

(Continued)

FOREIGN PATENT DOCUMENTS

| | | |
|---|---|---|
| WO | WO2012087411 | 6/2012 |
| WO | WO 2012/158521 | 11/2012 |
| WO | WO2012174216 | 12/2012 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Hal Schnee
(74) *Attorney, Agent, or Firm* — Davis Wright Tremaine LLP

(57) ABSTRACT

In a nonvolatile memory, hybrid blocks are initially written with only lower page data. The hybrid blocks later have middle and upper page data written. For high speed writes, data is written to a hybrid block and two or more Single Level Cell (SLC) blocks. The data from the SLC blocks are copied to the hybrid block at a later time in a folding operation.

23 Claims, 16 Drawing Sheets

(56) References Cited

U.S. PATENT DOCUMENTS

| | | |
|---|---|---|
| 6,222,762 B1 | 4/2001 | Guterman et al. |
| 7,016,226 B2 | 3/2006 | Shibata et al. |
| 7,057,939 B2 | 6/2006 | Li et al. |
| 7,120,051 B2 | 10/2006 | Gorobets et al. |
| 7,315,916 B2 | 1/2008 | Bennett et al. |
| 7,505,320 B2 | 3/2009 | Li |
| 7,508,721 B2 | 3/2009 | Li et al. |
| 7,951,669 B2 | 5/2011 | Harari et al. |
| 8,027,195 B2 | 9/2011 | Li et al. |
| 8,094,400 B1 | 1/2012 | Han |
| 8,144,512 B2 | 3/2012 | Huang et al. |
| 8,214,700 B2 | 7/2012 | Chen |
| 8,244,960 B2 | 8/2012 | Paley et al. |
| 8,307,241 B2 | 11/2012 | Avila et al. |
| 8,472,280 B2 | 6/2013 | Li |
| 8,566,671 B1 | 10/2013 | Ye et al. |
| 8,750,042 B2 | 6/2014 | Sharon et al. |
| 2007/0109858 A1 | 5/2007 | Conley et al. |
| 2010/0174847 A1 | 7/2010 | Paley et al. |
| 2010/0318721 A1 | 12/2010 | Avila et al. |
| 2010/0318839 A1 | 12/2010 | Avila et al. |
| 2011/0072332 A1 | 3/2011 | Tomlin |
| 2011/0096601 A1 | 4/2011 | Gavens et al. |
| 2011/0099418 A1 | 4/2011 | Chen |
| 2011/0099460 A1 | 4/2011 | Dusija et al. |
| 2011/0149650 A1* | 6/2011 | Huang et al. ............ 365/185.03 |
| 2011/0153912 A1 | 6/2011 | Gorobets et al. |
| 2011/0267885 A1 | 11/2011 | Kato |
| 2012/0001247 A1 | 1/2012 | Alsmeier |
| 2012/0182803 A1 | 7/2012 | Shirakawa |
| 2012/0256247 A1 | 10/2012 | Alsmeier |
| 2012/0272120 A1 | 10/2012 | Chen |
| 2012/0287710 A1 | 11/2012 | Shirakawa |
| 2012/0297122 A1 | 11/2012 | Gorobets et al. |
| 2012/0311244 A1 | 12/2012 | Huang et al. |
| 2013/0024605 A1 | 1/2013 | Sharon et al. |
| 2013/0028021 A1 | 1/2013 | Sharon et al. |
| 2013/0031429 A1 | 1/2013 | Sharon et al. |
| 2013/0031430 A1 | 1/2013 | Sharon et al. |
| 2013/0031431 A1 | 1/2013 | Sharon et al. |
| 2013/0107628 A1 | 5/2013 | Dong et al. |
| 2013/0155769 A1 | 6/2013 | Li et al. |

OTHER PUBLICATIONS

U.S. Appl. No. 14/099,027 entitled "Lower Page Only Host Burst Writes," filed Dec. 6, 2013, 46 pages.

U.S. Appl. No. 13/934,013, entitled Write Operations for Defect Management in Nonvolatile Memory, filed Jul. 2, 2013, 47 pages.

U.S. Appl. No. 14/097,523, entitled Systems and Methods for Partial Page Programming of Multi Level Cells, filed Dec. 5, 2013, 41 pages.

U.S. Appl. No. 14/086,162, entitled Update Block Programming Order, filed Nov. 21, 2013, 45 pages.

U.S. Appl. No. 13/929,368, entitled Efficient Post Write Read in Three Dimensional Nonvolatile Memory, filed Jun. 27, 2013, 49 pages.

U.S. Appl. No. 13/788,415 entitled Write Sequence Providing Write Abort Protection, filed Mar. 7, 2013, 36 pages.

U.S. Appl. No. 14/094,550 entitled "Multi-Die Write Management," filed Dec. 2, 2013, 32 pages.

* cited by examiner

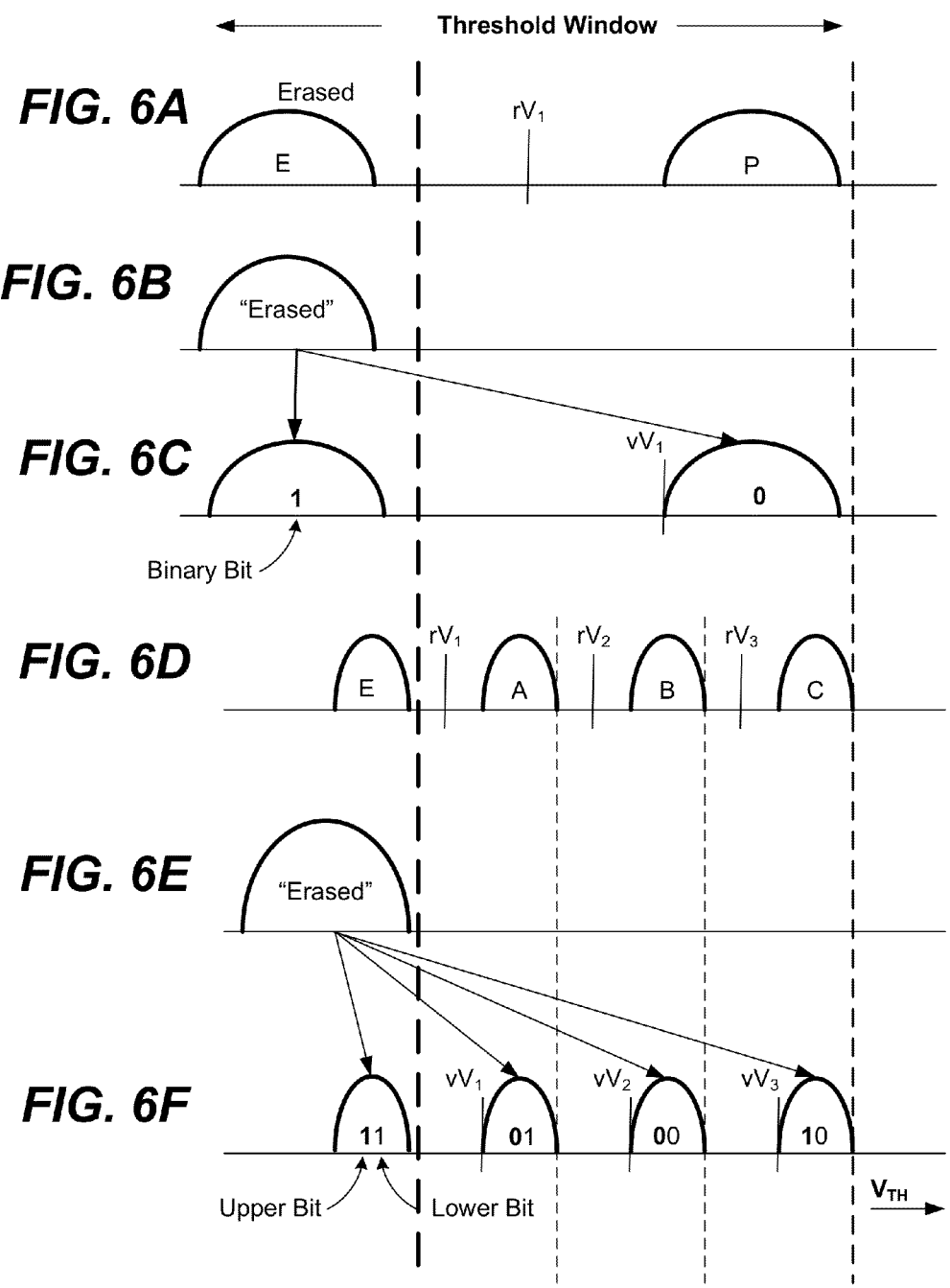

Multistate Memory

Lower Page Programming (2-bit Code)

Upper Page Programming (2-bit Code)

Lower Page Read (2-bit Code)

Upper Page Read (2-bit Code)

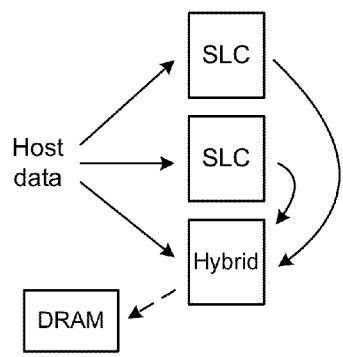
FIG. 14
| | LP | MP | UP |
|---|---|---|---|
| WL0 | 0 | 0' | 2' |
| WL1 | 1 | 1' | 4' |
| WL2 | 2 | 3' | 6' |
| WL3 | 3 | 5' | |
| ... | ... | | |
| WLK | K | | |
FIG. 15
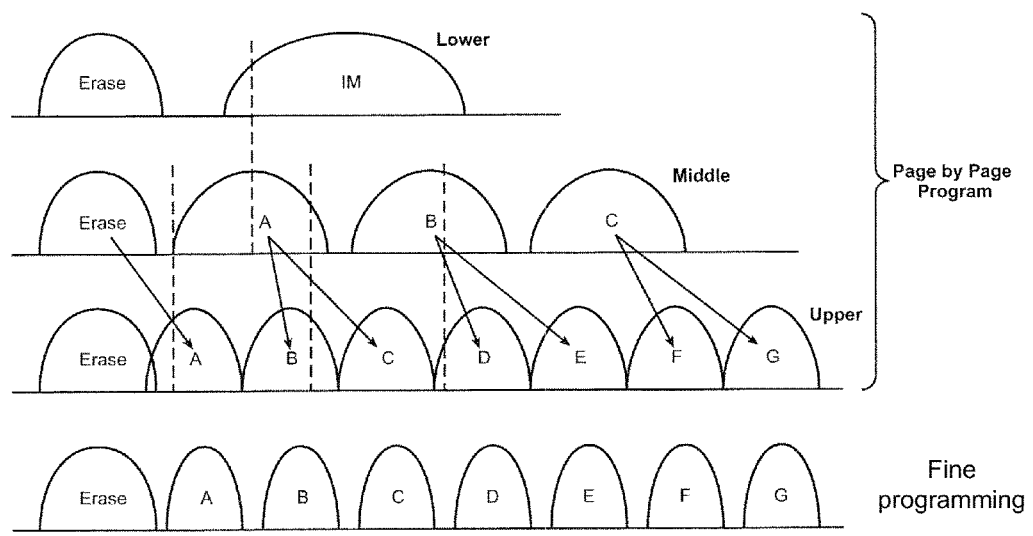
FIG. 16

IN-SITU BLOCK FOLDING FOR NONVOLATILE MEMORY

BACKGROUND

This application relates to the operation of re-programmable nonvolatile memory systems such as semiconductor flash memory which record data using charge stored in charge storage elements of memory cells and to methods of operating such memory systems.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In a Multi Level Cell (MLC) memory array data may initially be written rapidly in one-bit-per-cell form and later copied into cells where three or more bits are stored per cell. Rather than write all data in Single Level Cell (SLC) blocks and then copy to MLC blocks, some of the data is initially written to a hybrid block which subsequently becomes the destination for copying. Thus, for example, rather than writing three SLC blocks and folding them into one MLC block, an initial write operation may write two SLC blocks and a hybrid block. The two SLC blocks may then be folded into the hybrid block. This reduces the number of blocks used for temporary storage from three to two. So the number of blocks to be erased after such an operation is reduced from three to two, thereby reducing wear and increasing longevity. Write speeds are significantly faster than if all data was directly written in MLC format. Write speeds may approach SLC speeds because two of the three blocks are written as SLC blocks and only lower page data is programmed in the hybrid block (which is generally somewhat slower than SLC programming but significantly faster than middle or upper page MLC programming).

An example of a method of operating a Multi-Level Cell (MLC) nonvolatile memory array that stores more than two bits per page, includes: programming a first logical page of data one-bit-per-cell in a first physical page using a first programming scheme; programming a second logical page of data one-bit-per-cell in a second physical page using a second programming scheme; programming a third logical page of data one-bit-per-cell in a third physical page using the second programming scheme; subsequently, copying the second and third logical pages of data to the first physical page where they are programmed with the first logical page; and marking the second physical page and the third physical page as obsolete.

The first logical page of data may be maintained in Dynamic Random Access Memory (DRAM) during the copying of the second and third logical pages of data to the first physical page. The first physical page may be in a first block that comprises a plurality of physical pages and all of the plurality of physical pages of the first block may be programmed one-bit-per-cell prior to the copying. The second physical page may be in a second block, the third physical page may be in a third block, and the second and third blocks may have all physical pages programmed one-bit-per-cell prior to the copying. One or more additional copying steps may be directed to additional physical pages of the plurality of physical pages of the first block and may be performed between copying the second logical page of data to the first physical page and copying the third logical page of data to the first physical page. The one-bit-per-cell data from each individual physical page of the plurality of physical pages of the first block may be maintained in DRAM for a time during which additional bits are copied to cells of the plurality of physical pages. Foggy programming may be performed and fine programming may subsequently be performed when copying, and one-bit-per-cell data of an individual physical page may be maintained until after completion of fine programming of the all logical pages of the physical word line (i.e. lower, middle, and upper logical pages, in this example). The MLC nonvolatile memory array may be a three dimensional nonvolatile memory array. The first programming scheme may be an MLC lower page programming scheme, and the second programming scheme may be an SLC scheme. The first programming scheme may program memory cell threshold voltages to a first threshold voltage range, the second programming scheme may program memory cell threshold voltages to a second threshold voltage range, the second threshold voltage range being higher than the first threshold voltage range.

An example of a block-erasable nonvolatile memory system includes: a plurality of Single Level Cell (SLC) blocks that store one bit per cell; a plurality of Multi Level Cell (MLC) blocks that store three or more bits per cell; and a plurality of hybrid blocks that initially store only one bit per cell in cells of three or more word lines and are subsequently further programmed to store two or more additional bits per cell in the cells of the three or more word lines. A Dynamic Random Access Memory (DRAM) may store a copy of data initially stored in a hybrid block during subsequent further programming of the hybrid block. The hybrid block may initially store one bit per cell in cells of substantially all word lines of the hybrid block. A copying circuit may copy data from two or more SLC blocks to a hybrid block that contains one bit per cell. Programming circuits may program SLC blocks using an SLC programming scheme and program initial one-bit-per-cell data in hybrid blocks using a lower page MLC programming scheme that is different to the SLC programming scheme. The plurality of SLC blocks, the plurality of MLC blocks, and the plurality of hybrid blocks are formed in a three-dimensional memory array that is monolithically formed in a plurality of physical levels, memory cells of an individual physical level having an active area disposed above a silicon substrate. The memory system may include circuitry associated with the operation of the memory cells.

An example of a block-erasable nonvolatile memory system includes: a three dimensional block-erasable memory array that is monolithically formed as a plurality of physical levels of memory cells, memory cells of at least one physical level having an active area disposed above a silicon substrate, the three dimensional memory array comprising: a plurality of Single Level Cell (SLC) blocks that store one bit per cell; a plurality of Multi Level Cell (MLC) blocks that store three or more bits per cell; and a plurality of hybrid blocks that initially store only one bit per cell in cells of three or more word lines and are subsequently further programmed to store two or more additional bits per cell in the cells of the three or more word lines; and circuitry associated with the operation of the memory cells.

The plurality of hybrid blocks may initially store only one bit per cell in cells of all word lines of an individual block and may only subsequently be programmed to store additional bits. The circuitry associated with the operation of the memory cells may include write circuits that program data in SLC blocks using an SLC programming scheme and that program one bit per cell in hybrid blocks using an MLC lower page programming scheme that is different to the SLC programming scheme.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming a population of memory cells.

FIG. 14 shows an example of how copying to a hybrid block may be implemented using DRAM to protect lower page data.

FIG. 15 shows an example of programming order of logical pages in an MLC block.

FIG. 16 shows an example of MLC programming including foggy and fine programming stages.

DETAILED DESCRIPTION

Memory System

Figure 1:
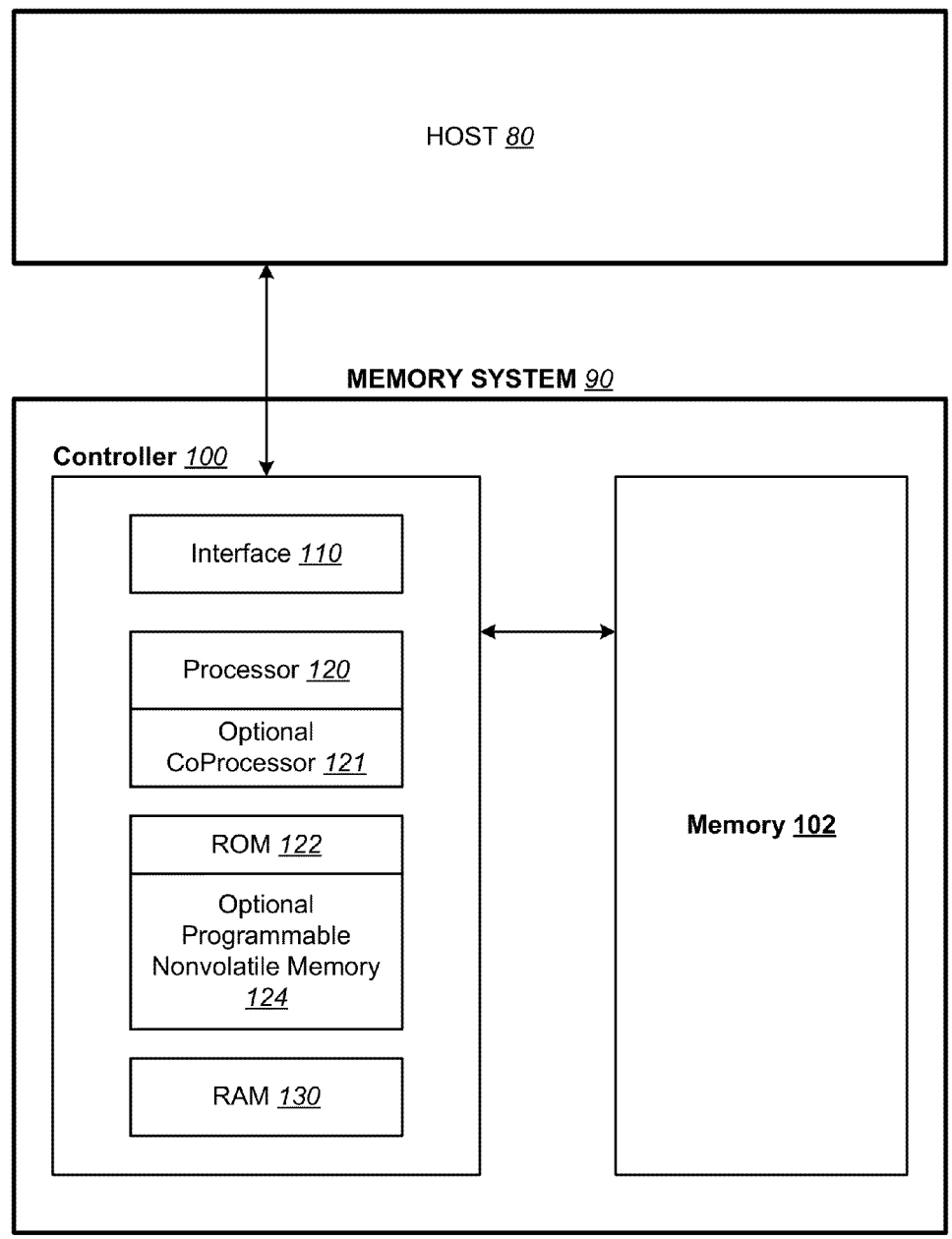
FIG. 1 illustrates schematically the main hardware components of a memory system suitable for implementing the present invention.

FIG. 1 illustrates schematically the main hardware components of a memory system suitable for implementing aspects of the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Example

Figure 2:
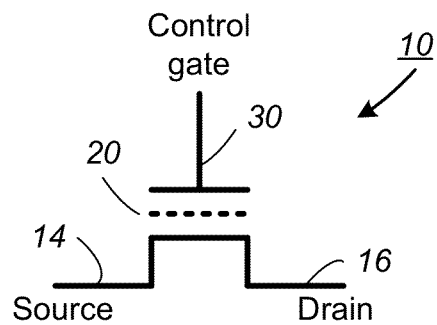
FIG. 2 illustrates schematically a non-volatile memory cell.

FIG. 2 illustrates schematically an example of a non-volatile charge-storage memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

Figure 3:
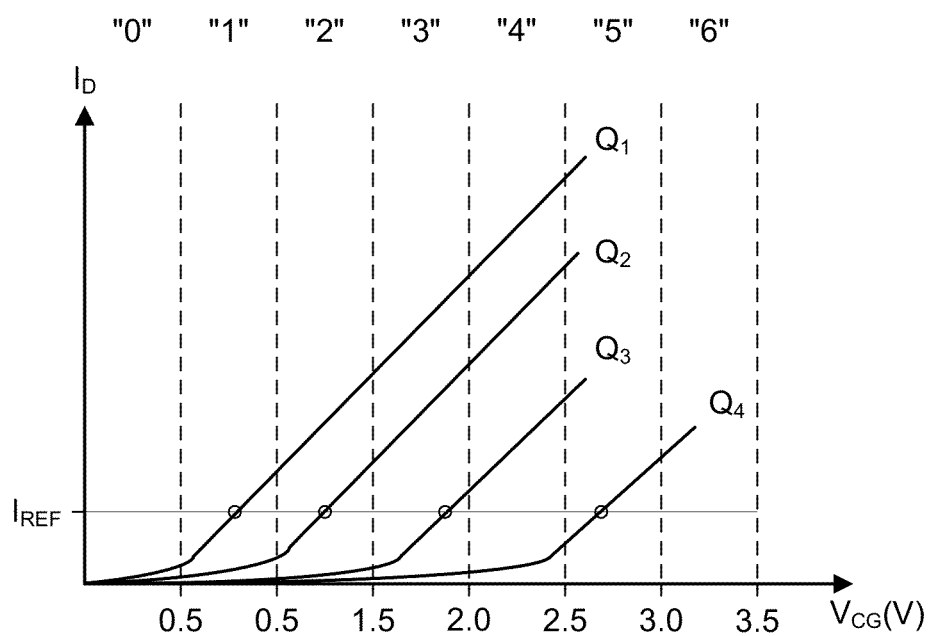
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
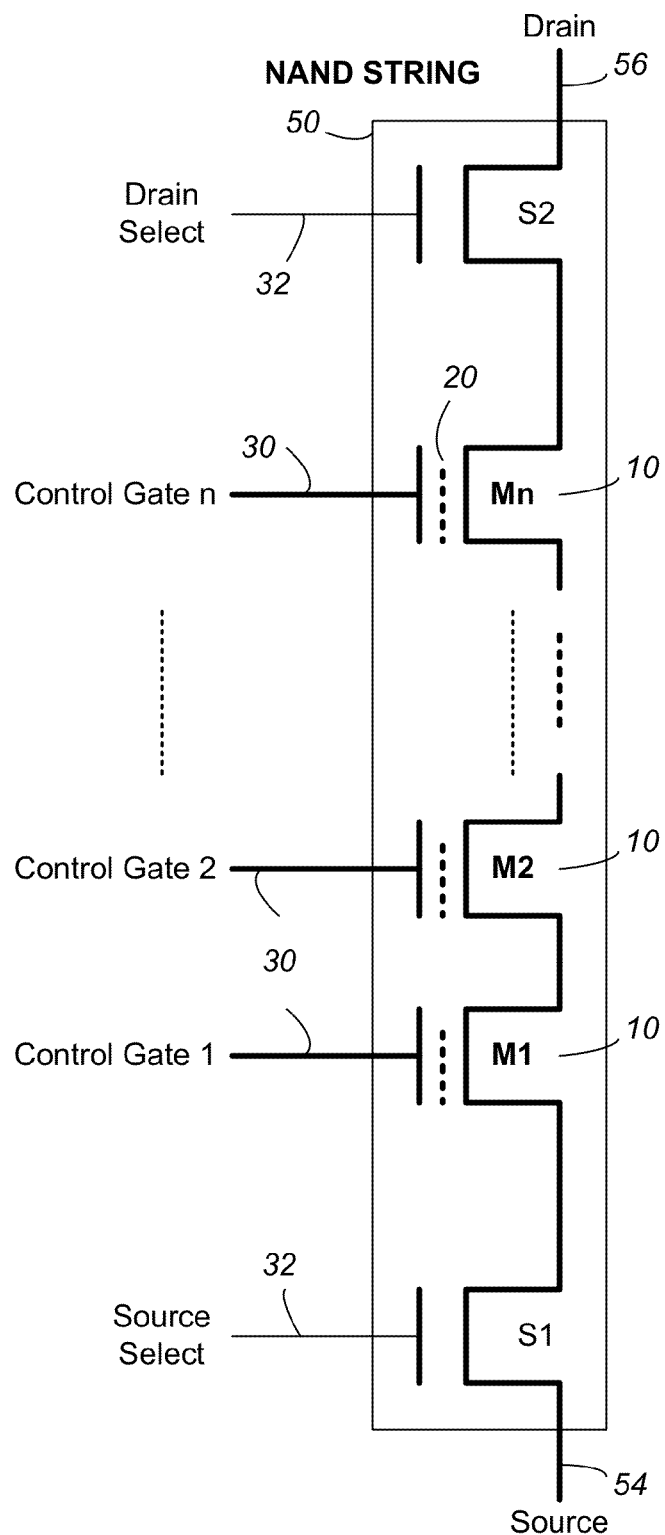
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
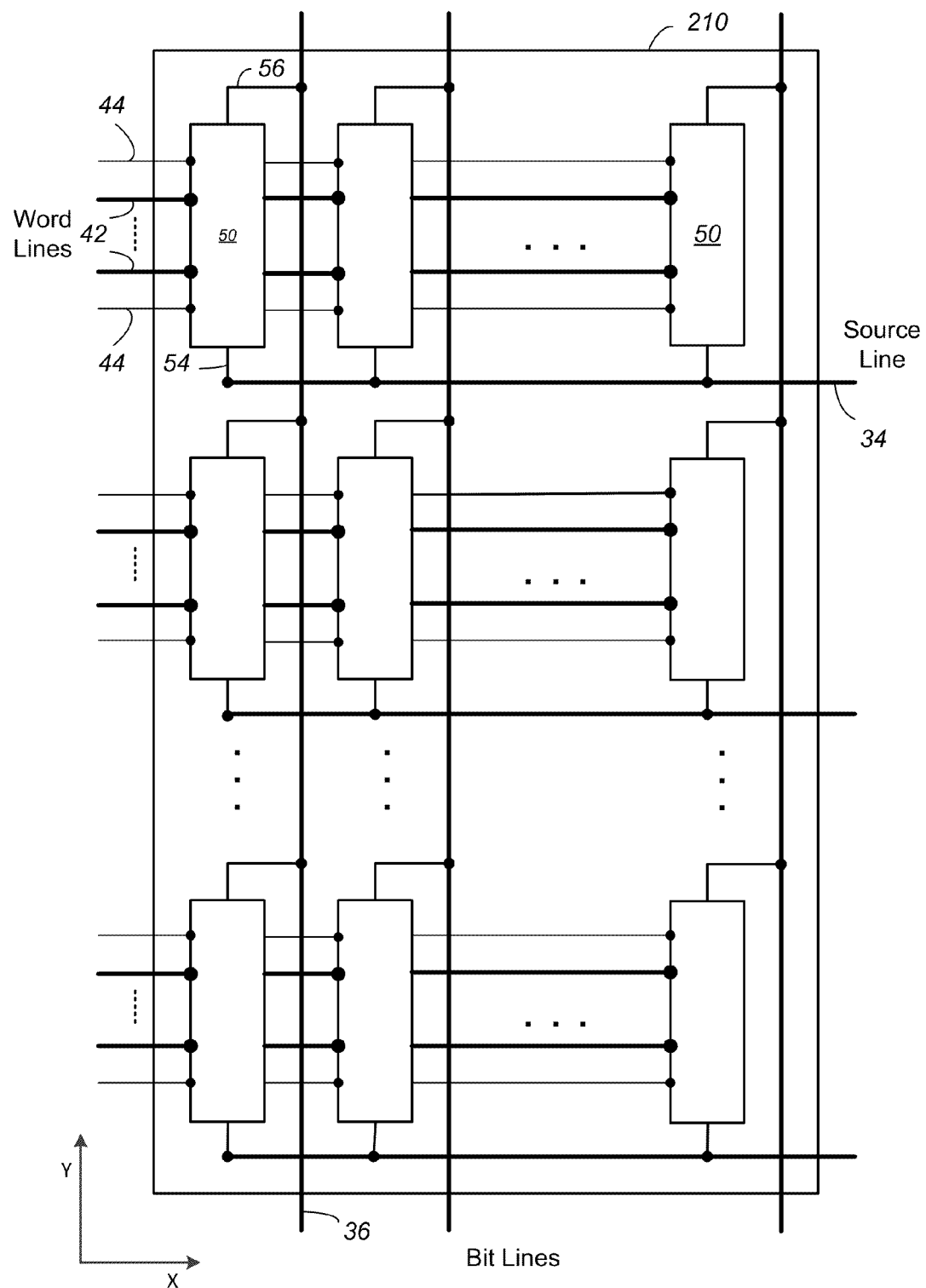
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
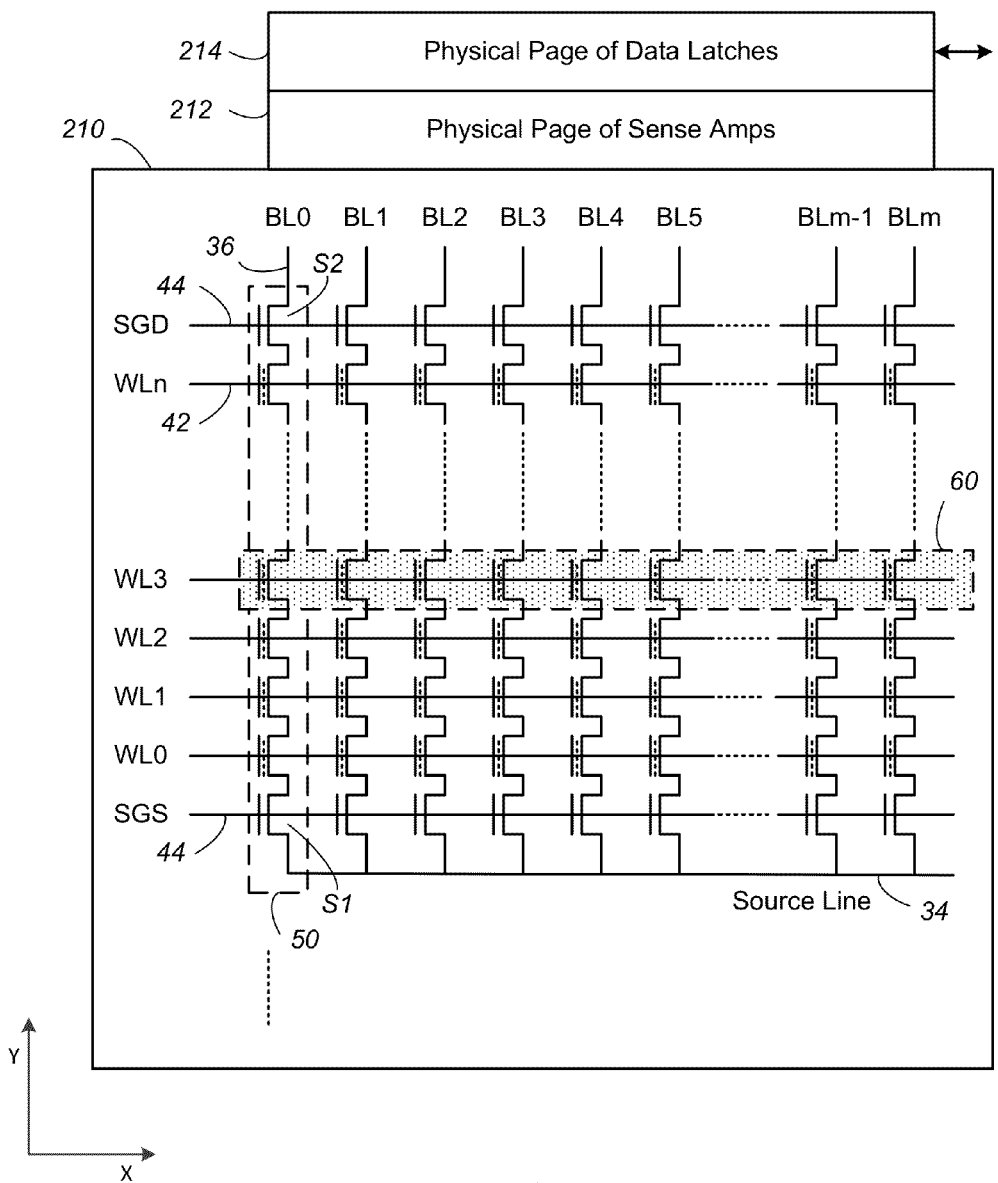
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector may include user data and overhead data.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, $rV_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will be understood that memory cells may be configurable as either 2-state or 4 (or more) state so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three subpasses respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Bit-by-Bit MLC Programming and Reading

Figure 7A:
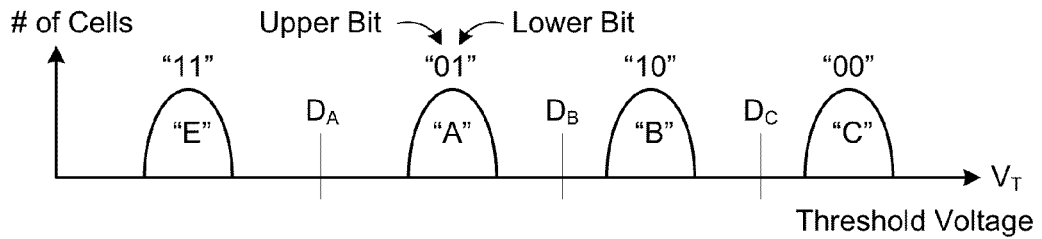
FIGS. 7A-7E illustrate programming of upper and lower page bits in MLC.

FIGS. 7A-7E illustrate the programming and reading of a 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
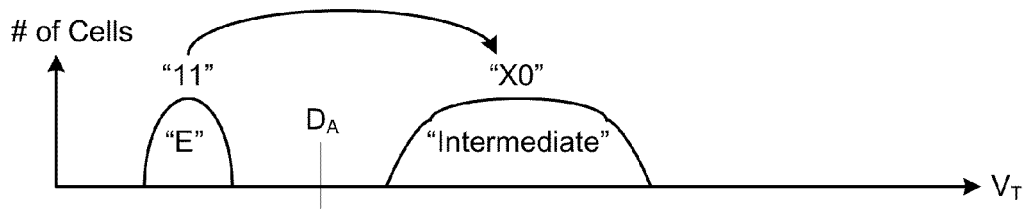

FIG. 7B illustrates the lower page programming (lower bit) in a 2-pass programming scheme using the 2-bit code. The first pass lower page programming has the logical state (upper bit, lower bit)=(1, 1) transits to some intermediate state (x, 0) as represented by programming the "unprogrammed" memory state "E" to the "intermediate" state designated by (x, 0) with a programmed threshold voltage greater than $D_A$ but less than $D_C$. Memory cells programmed with lower page bits only (no upper page bits) may be read using $D_A$.

Figure 7C:
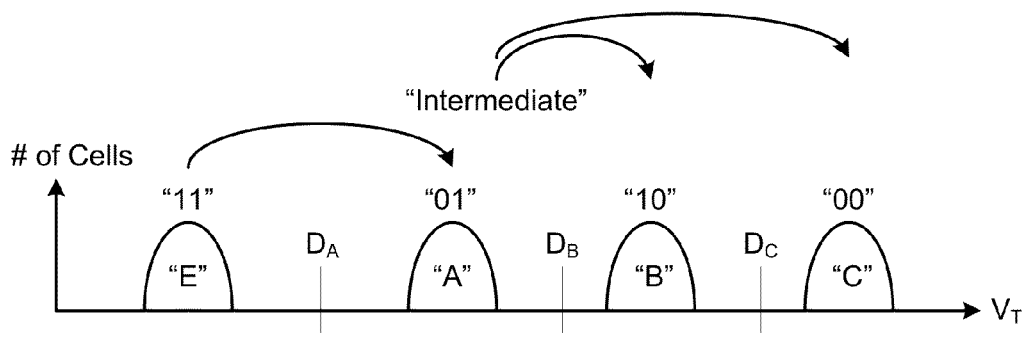

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "E" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
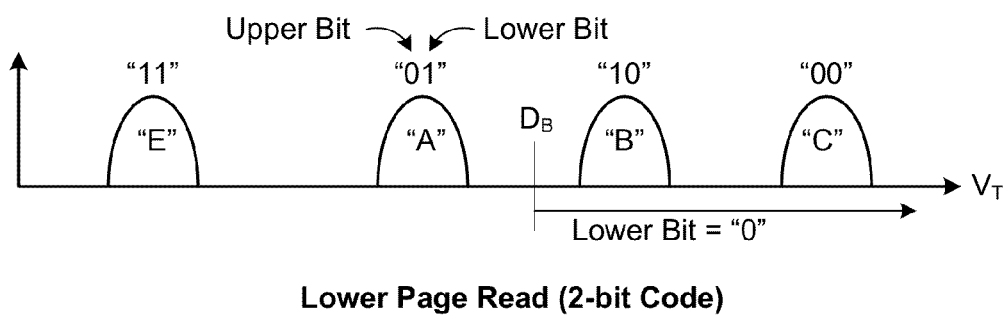

FIG. 7D illustrates the read operation that is required to discern the lower bit of the 4-state memory encoded with the 2-bit code. If the upper page has been programmed then a read operation using $D_B$ will yield the lower page data correctly. On the other hand, if the upper page has not yet been programmed, the lower page data should be read by a read operation using $D_A$.

Figure 7E:
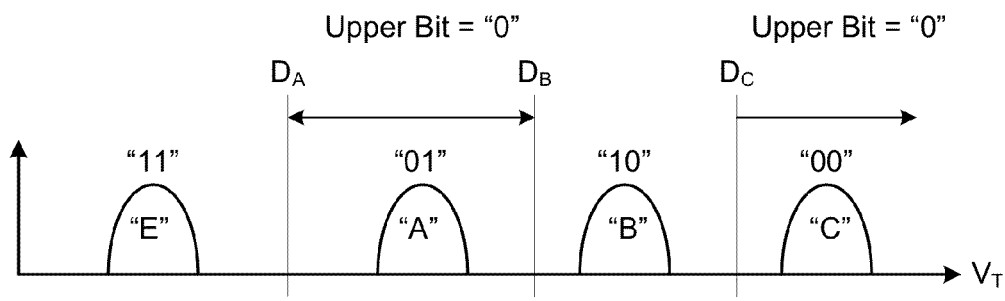

FIG. 7E illustrates the read operation that is required to discern the upper bit of the 4-state memory encoded with the 2-bit code. As is clear from the figure, the upper page read will require a 3-pass read relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, where memory cells store three bits per cell (using eight states), a physical page of memory cells may store three logical pages, a lower page, a middle page, and an upper page.

Comparing the lower page programming of FIG. 7B with the upper page programming of FIG. 7C shows some important differences. Lower page programming raises threshold voltages less than upper page programming (i.e. the intermediate state is not as high as B and C states). Also, the intermediate distribution is broad so that programming does not have to be very precise. Accordingly, lower page programming may be performed more rapidly than upper page programming. Reading of data stored as lower page only (no upper page data) may also be quicker than reading upper page data because a single read (single discrimination voltage, e.g. FIG. 7B) may provide lower page data while three reads (three discrimination voltages, e.g. FIG. 7E) may be needed to obtain upper page data.

3-D NAND Example

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8B:
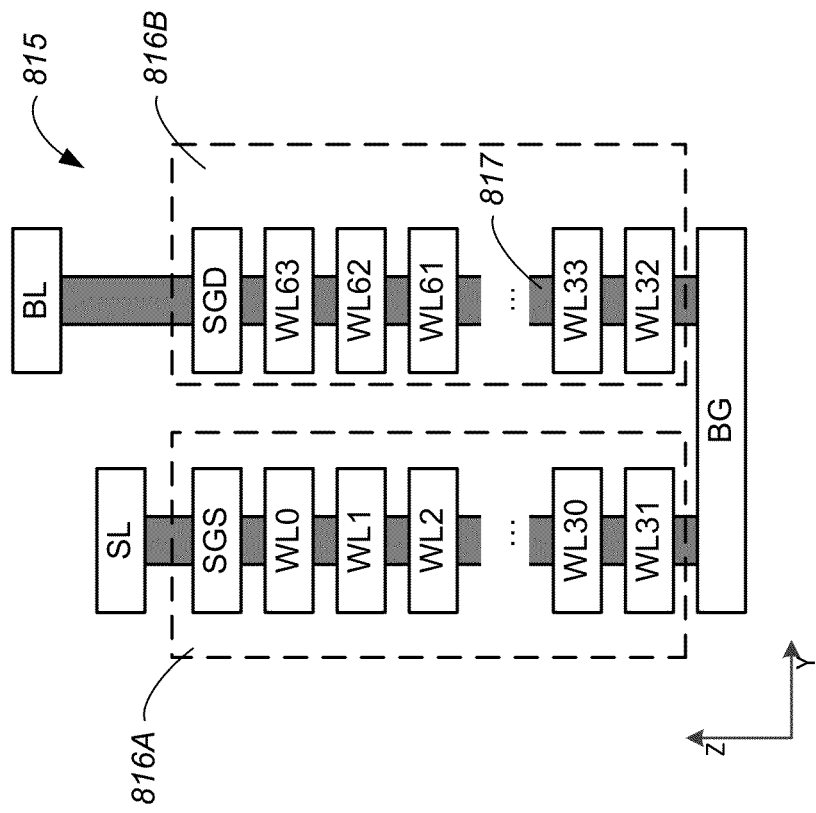
FIG. 8B shows an example of a physical structure of a U-shaped 3-D NAND string.
Figure 8A:
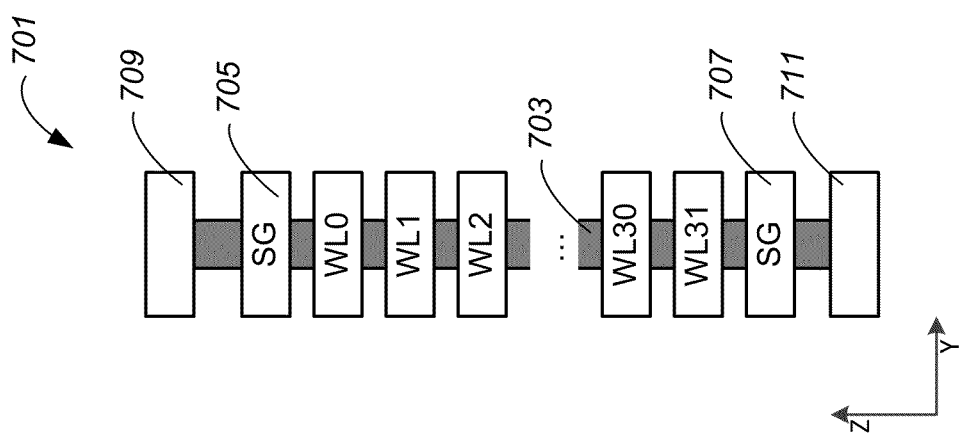
FIG. 8A shows an example of a physical structure of a 3-D NAND string.

FIG. 8A shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8A shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8B shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
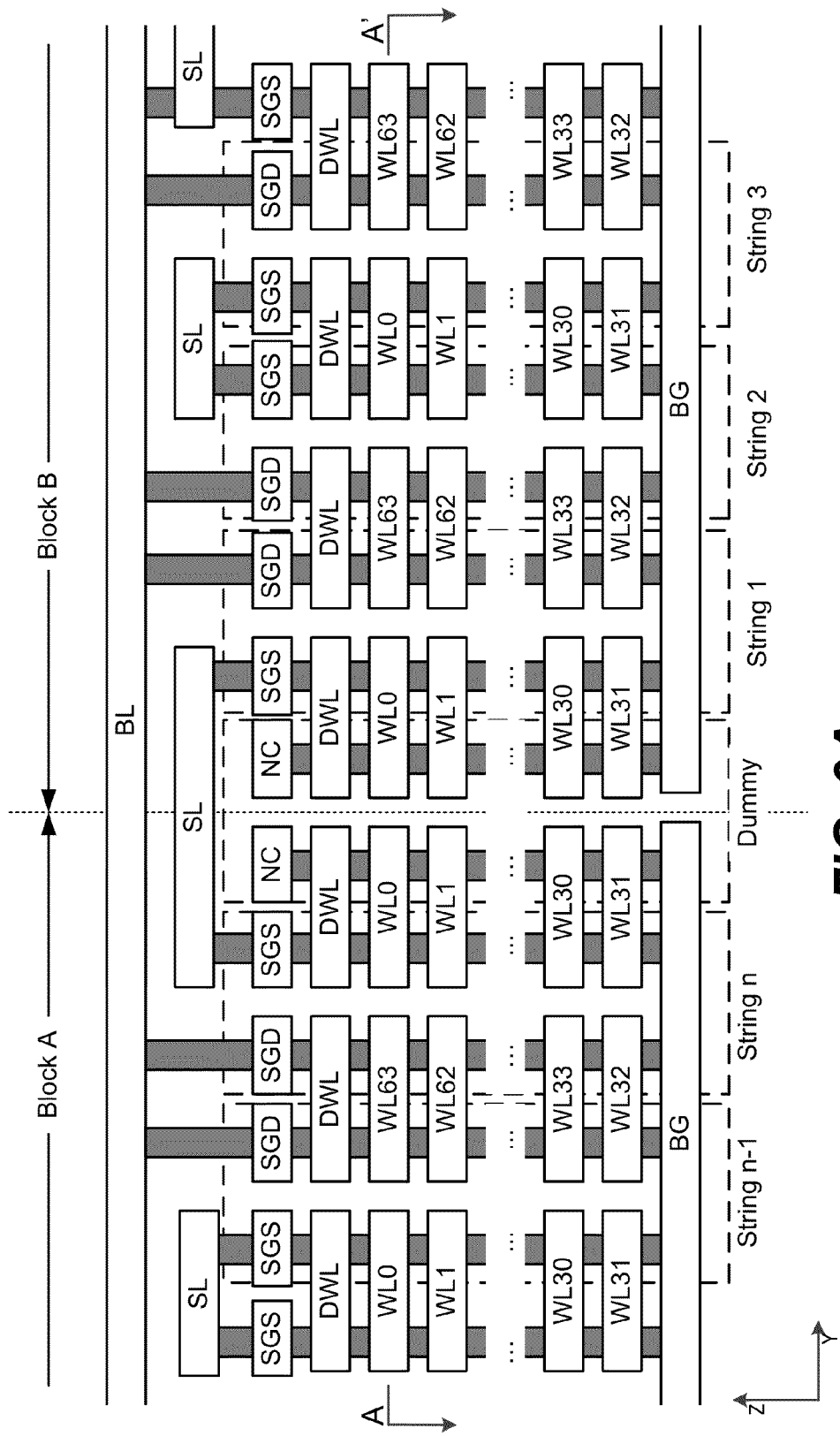
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Figure 9B:
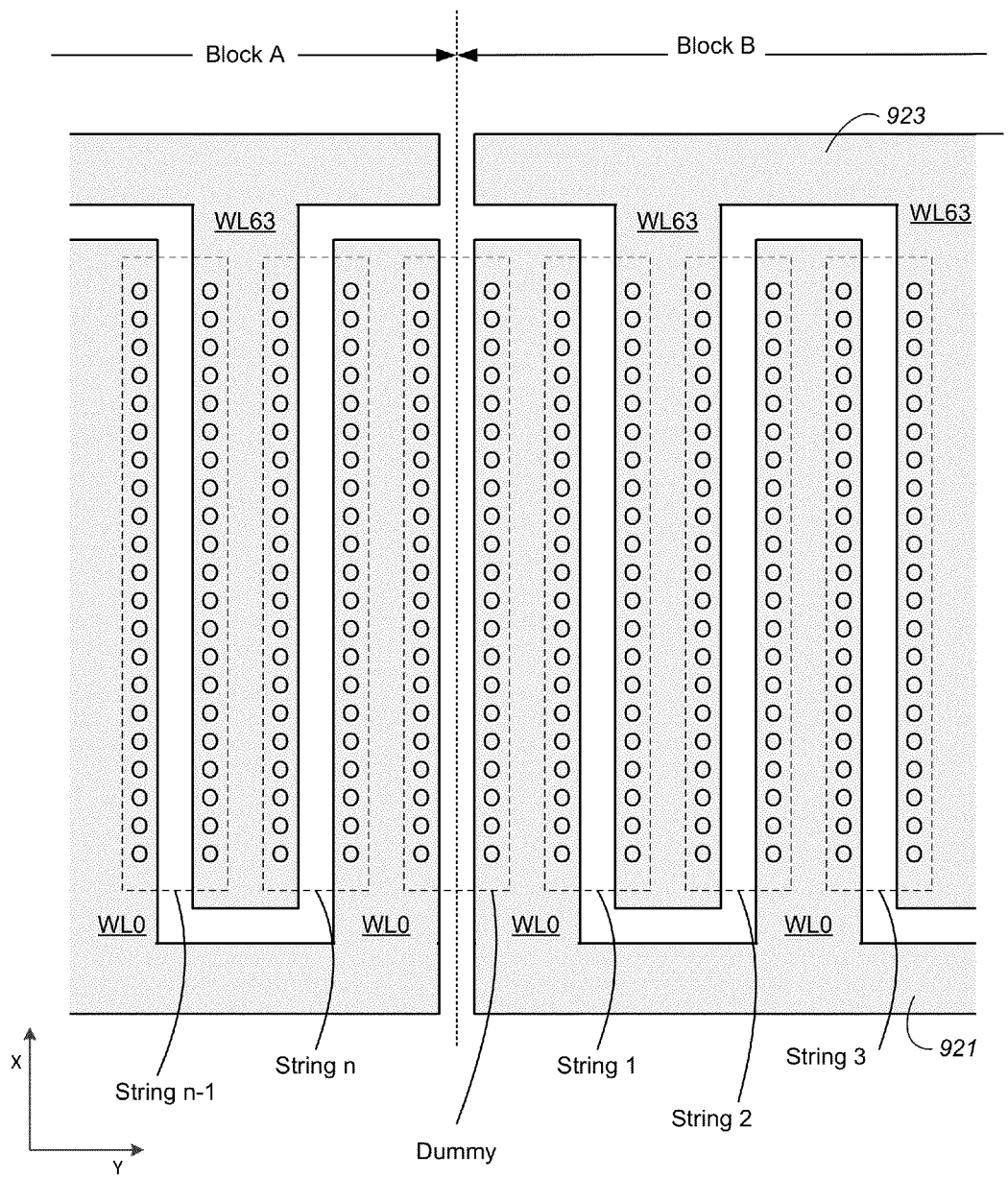
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

SLC and MLC Operation

In both two dimensional and three dimensional memories, it is common to operate some blocks in a memory array as SLC blocks and others as MLC blocks. For example, data that is expected to be stored for a relatively long period without updates may be stored in MLC blocks while data that is likely to be frequently updated may be stored in SLC. Blocks may be configured as SLC or MLC according to requirements.

Figure 10:
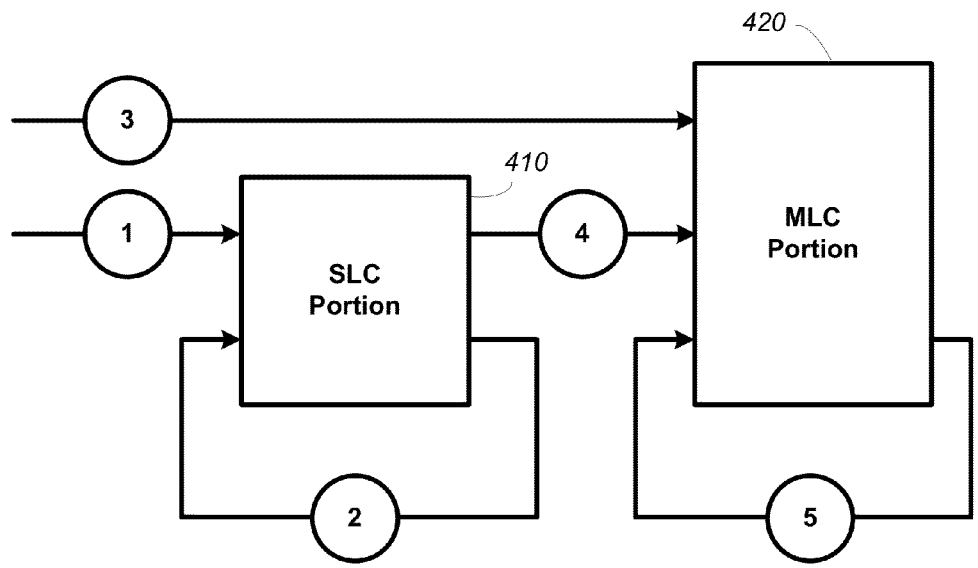
FIG. 10 illustrates operation of SLC and MLC portions in a memory system.

FIG. 10 illustrates schematically the data path between an SLC portion 410 and an MLC portion 420 in an example of a memory that has both SLC blocks and MLC blocks. This may be considered a two layer system. The first layer is the main input buffer for incoming data and operates on the SLC portion 410 of a NAND memory which is faster/higher-endurance/higher-cost memory compared to the MLC portion 420. The second layer is the main data archive storage and operates on the MLC portion which is slower/lower-endurance/lower-cost memory.

The main operations in such system are labeled in FIG. 10 are as follows:
1. Host data or control data write to SLC portion
2. Data copy within SLC portion to reclaim partially obsolete SLC block, sometimes referred to as 'compaction'
3. Host data direct write to MLC portion, usually used for long sequential writes
4. Data move from SLC to MLC portion, sometimes referred to as 'folding'
5. Data copy within MLC portion for MLC block reclaim, sometimes referred to as 'MLC compaction'

The above structure can be built with many other additional features, for example, features related to the use of different addressing schemes and addressable data unit granularity.

Figure 11A:
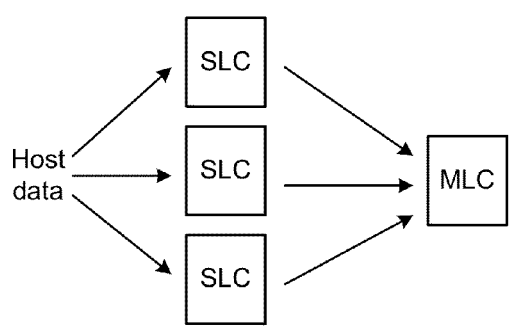
FIG. 11A illustrates initial writing of host data in three SLC blocks and subsequent copying from the SLC blocks to an MLC block.

In some cases, it is desirable to write data quickly, even at the expense of storage density, by writing just one bit per cell initially. The data can later be stored in a more efficient manner (two or more bits per cell) when time permits. FIG. 11A shows an example of host data that is initially written in three SLC blocks in order to provide high write speed (using SLC blocks as a write buffer) and is later copied to an MLC block in a folding operation in order to provide efficient use of memory space. After data is copied to the MLC block, the three SLC blocks may be erased.

In some cases, a memory system may store data in a burst mode as described in U.S. patent application Ser. No. 14/099, 027, filed on Dec. 6, 2013, entitled "Lower page only host burst writes" which is hereby incorporated by reference in its entirety.

Figure 11B:
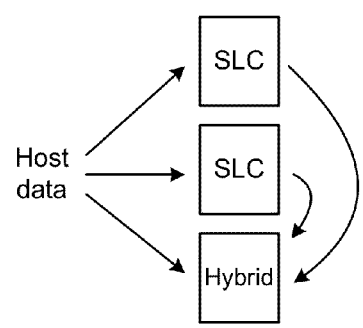
FIG. 11B illustrates initial writing of host data in two SLC blocks and a hybrid block and subsequent copying from the SLC blocks to the hybrid block.

FIG. 11B illustrates a high speed write scheme according to an embodiment of the present invention. In particular, FIG. 11B shows host data being initially distributed to two SLC blocks and a hybrid block. Data is written in the hybrid block one-bit-per-cell so that the data is rapidly written compared with MLC writing, but is generally written in a manner that is slower than SLC writing. In particular, data is written in the hybrid block in lower page MLC format so that additional data can be stored in the same physical pages later. Subsequently, instead of copying the data from all three blocks to an MLC block, data is copied from the two SLC blocks to the hybrid block. Data from one SLC block may be written as middle page data in the hybrid block and data from another SLC block may be written as upper page data in the hybrid block. After all data from the SLC blocks is copied to the hybrid block the two SLC blocks may be erased. It will be understood that while the one-bit-per cell data that is initially written in the hybrid block is considered lower page MLC data in this example, in other examples using other data programming schemes, the one-bit-per cell data that is initially stored in the hybrid block may be considered middle or upper page data (e.g. when using a different assignment of logical states to threshold voltage ranges).

Comparing the example of FIG. 11B with that of FIG. 11A it can be seen that after copying in FIG. 11A three SLC blocks are obsolete and are erased. In contrast, in the example of FIG. 11B, only two SLC blocks are obsolete and are erased. Thus, the number of block needed for a given write operation is reduced and the number of blocks that are erased is reduced. Because wear in nonvolatile memory arrays such as flash memory arrays is generally a function of the number of write-erase cycles, reducing the number of such cycles can have a significant effect on block failure. Blocks may wear out later and the life expectancy of the product is increased accordingly. Also, the pool of SLC blocks that must be maintained to accommodate host writes may be reduced because hybrid blocks are used to accommodate host writes also. Alternatively, the pool of SLC blocks may be maintained so that the addition of hybrid blocks provides additional capacity for host writes, or some combination of these two approaches may be used. In the example shown, the MLC blocks store three bits per memory cell so that a ratio of two SLC blocks to one hybrid block is appropriate. Where an MLC block stores a different number of bits per cell a different ratio may be appropriate (e.g. three to one where MLC stores four bits per cell, etc.).

Figure 12:
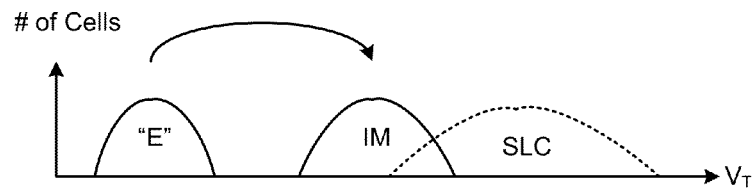
FIG. 12 illustrates memory cells programmed with lower page MLC data and with SLC data.

FIG. 12 illustrates some differences between storing one bit per cell in an SLC format and storing one bit per cell in lower page MLC format. When memory cells are programmed in lower page MLC format, some memory cells are programmed from the erased state to an intermediate ("IM") state that is different to the programmed SLC state (shown by dashed distribution). In particular, because memory cells that are programmed with only lower page data in an MLC block may be subject to further programming, they are programmed to a threshold voltage range that is generally lower than the threshold voltage range for the programmed SLC state and the range may be narrower than that of the programmed SLC state. Such programming may use relatively small voltage pulses to avoid overprogramming and may thus take longer than SLC programming where larger voltage pulses can be used because overprogramming is of less concern. It will be understood that FIG. 12 illustrates particular examples of SLC and lower page MLC programming and that other threshold voltage distributions are also possible. In particular, SLC programming may use any suitable threshold voltage range because no further programming is performed after SLC programming. For example, SLC programming could use the same threshold voltage range as lower page MLC programming. However, for speed and reliability it is generally preferable to use a different threshold voltage range as shown.

Figure 13:
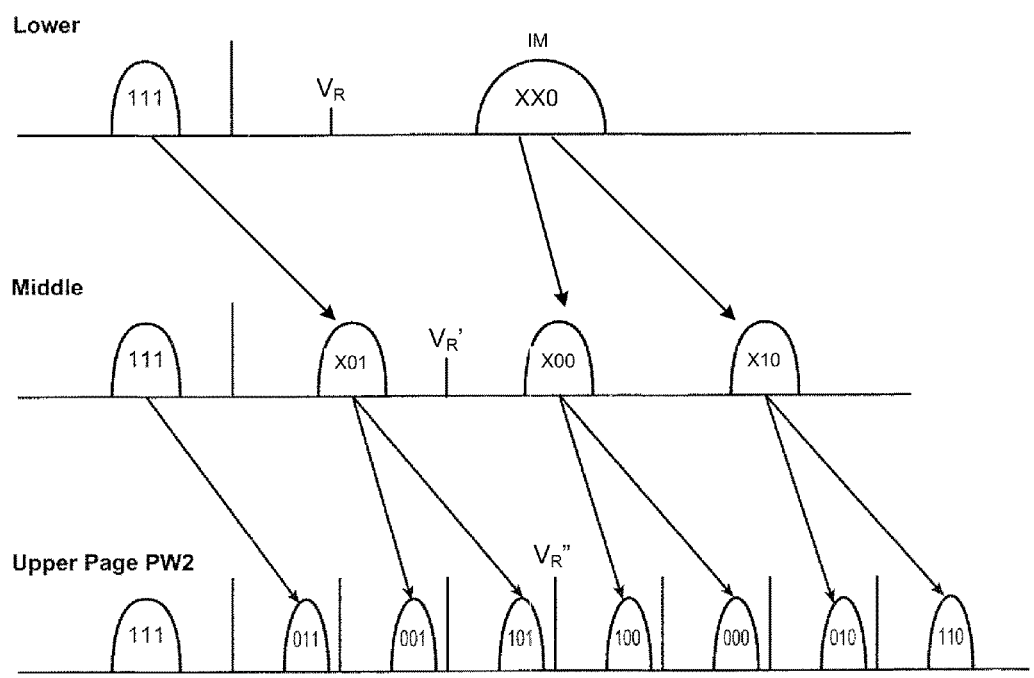
FIG. 13 shows an example of MLC programming of three logical pages in a physical page.

FIG. 13 illustrates programming of lower, middle, and upper pages in a three-bit-per-cell MLC block. It can be seen that lower page programming increases threshold voltages of some memory cells from the erased (111) state to an intermediate (XX0) "IM" state. Subsequent programming of middle page data raises some memory cell threshold voltages from the IM state to X00 and X10 states. Subsequent to middle page programming, upper page programming raises threshold voltages of some of these cells still further to 100, 000, 010, and 110 states. It can be seen that the threshold voltage range for cells in the IM state must be low enough to allow two rounds of subsequent programming so that the threshold voltage range of the IM state does not extend to the top, or to close to the top of the threshold voltage range available for data storage. In contrast, the threshold voltage range for SLC programming is not so constrained. The encoding scheme shown in FIG. 13 is intended as an example to show how three logical pages may be programmed in a physical page. It will be understood that other encoding schemes may also be used and that more than three logical pages may be stored in a physical page.

FIG. 13 illustrates why programming of lower page data is faster than programming middle or upper page data. The IM distribution is wider, allowing for less precise programming and verification only requires using a single discrimination voltage. Subsequent middle and upper page programming require finer programming and verification using multiple verification steps. While lower page MLC programming may be slower than SLC programming it is significantly faster than middle or upper page MLC programming. Examples of MLC programming order are described in U.S. Pat. No. 8,472,280, which is hereby incorporated by reference in its entirety.

One potential problem with copying SLC data into a hybrid block rather than copying all data to an MLC block is that lower page data in a hybrid block could be unreadable if a write abort occurred during programming of upper page data. For example, if a write abort occurred during middle or upper page programming, it may be impossible to resolve memory states in a way that allows recovery of lower page data. If only lower page data is written then the two memory states (111 and XX0) can be resolved using read (discrimination) voltage $V_R$. After programming of middle page data, the lower page bit may be resolved using a different read voltage $V_R'$. After programming of upper page data, the lower page bit may be resolved using another different read voltage $V_R''$. However, if programming terminates during programming of either middle or upper page data then threshold voltage distributions may be in intermediate ranges that cannot be resolved to determine lower page bits. For example, it can be seen that if programming terminates during upper page programming then some memory cells with lower page bit=1 may be above $V_R'$ (if their destination is 101 state) and would be misread if $V_R'$ was used. If $V_R''$ is used then some memory cells being programmed from X00 state may be misread as having a lower page bit=1. Distributions for cells with lower page bits=0 and lower page bits=1 may overlap to some extent during programming so that the lower page is not resolvable using any read voltage.

When data is copied from SLC blocks to MLC blocks there is a risk to lower page data when programming higher page data in the same physical page. However, where data is being copied from an SLC block, the copy in the SLC block can be used as a backup until copying is confirmed as successful. Thus, in the case of copying from three SLC blocks to an MLC block in FIG. 11A the three SLC blocks provide backup copies of the lower, middle, and upper page data. In contrast, where a hybrid block is the destination for copying of data from SLC blocks, only the middle and upper page data is backed up in SLC blocks. The lower page data in the hybrid block may be the only copy available so that if a write abort occurred during subsequent programming of middle or upper page data (or if the data in the hybrid block is lost for some other reason, e.g. because of a physical memory defect such as a word line-to-word line short) then the lower page data would be unrecoverable.

FIG. 14 shows an example of how data can be protected from loss when using hybrid blocks. In particular, FIG. 14 shows some data written to two SLC blocks and some data written as lower page data in a hybrid block as previously described. The two SLC blocks are folded into the hybrid block as middle and upper page data thereby exposing the lower page data to risk of becoming unrecoverable in the event of a write abort (or if data in the hybrid block is damaged by some other mechanism, e.g. physical memory defect). FIG. 14 shows a Dynamic Random Access Memory (DRAM) that is used to store a copy of the lower page data from the hybrid block during further programming of the hybrid block with middle and upper page data. The lower page data may be written in DRAM at some time after the hybrid block is programmed with lower page data (indicated by dashed line). A copy of lower page data from a given word line is stored in DRAM before writing middle and upper page data to the word line and the data is kept until completion of upper and middle page writing. The amount of lower page data stored in DRAM depends on several factors and may include just one logical page at a time, two or more logical pages at a time, all lower page data for a block, or some other amount of data. A safe copy of lower page data is maintained throughout middle and upper page programming and is available in the event of a write abort. While this example shows a DRAM, it will be understood that other forms of storage may also be used for lower page data, including SRAM, or other volatile memory that can be frequently rapidly rewritten. In other examples, lower page data may be protected in some other manner during upper page programming.

Lower page data may be stored in DRAM for long enough to complete any additional programming that might affect the lower page data. While all lower page data for a block may be stored throughout copying to the block this may require a large amount of DRAM. In some cases, it may be possible to store just one lower page (one logical page) at a time while additional programming is performed along the word line that stores the lower page. However, in some cases multiple logical pages may be stored in DRAM at any time because of the order of programming logical pages to word lines in a given memory.

FIG. 15 shows an example of a programming order used in programming data in a hybrid block. Initially, logical pages 0-K are programmed as lower page data along word lines WL0-WLK. Subsequently, a folding operation programs logical pages 0'-6' as shown. Taking WL0 as an example, logical page 0' is programmed as middle page data and logical page 2' is programmed as upper page data, during which logical page 0 is maintained in DRAM. Logical page 1' is programmed as middle page data of WL1 in-between logical pages 0' and 2' during which logical page 1 is maintained in DRAM. Thus, at least two pages are maintained in DRAM at a time. Therefore, a DRAM with capacity for multiple logical pages may be used. Other programming sequences may require three or more logical pages to be stored in DRAM.

In some cases, a programming sequence may program data roughly in a first stage, followed by fine programming in a second stage. Examples of such foggy-fine programming are described in U.S. Pat. No. 8,472,280 which is hereby incorporated by reference in its entirety. FIG. 16 illustrates an example in which fine programming is performed after page by page programming of lower, middle, and upper logical pages. In some cases, fine programming may be performed only after neighboring word lines are programmed (e.g. programmed with middle and upper logical pages). Thus, in FIG. 15, fine programming of logical page 2' would only occur after logical page 4' is programmed as upper page data along WL1. This comes after programming logical page 3' along WL2 during which logical page 2 is maintained in DRAM. Thus, at least three logical pages would be saved in DRAM in this example. Where four or more logical pages are stored per physical page, the number of logical pages stored in DRAM is generally higher. Different programming schemes may also require different DRAM usage.

In some cases, copies of data may be maintained for some time during which a post-write read is performed. Examples of such post-write reads are described in U.S. Pat. Nos. 8,214,700 and 8,566,671. A copy of lower page data may be maintained in DRAM until completion of a post-write read in such memory systems. Alternatively, lower page data may be omitted when performing post-write read so that copies of higher pages (e.g. middle and upper pages) are maintained in SLC while no copy of lower page data is maintained. Higher page data is checked by post-write read and a backup copy is used if the post-write read indicates a high number of errors.

If a host read command for a portion of data is received prior to folding of the data into the hybrid block then the data may be read from the SLC blocks and the hybrid block. If a host read command is received during folding, or after folding and prior to confirmation of the folded data by a post-write read then the data may be read from the SLC blocks and DRAM rather from the MLC block so that the reliability of the data is ensured.

The nature of volatile memory, such as DRAM, requires that power be continuously provided for refresh operations that maintain data. Thus, in the event of a power loss, data that is stored in DRAM is lost. Where DRAM provides a backup copy of data stored in MLC, it is desirable to keep the data safe in the event of a power loss. According to an example, if a low power condition is detected (e.g. host sends command indicating power will be turned off, or a drop in supply voltage occurs, or some other indication is detected) then data in DRAM is flushed to nonvolatile memory. For example, data in DRAM may be stored in SLC blocks in the nonvolatile memory array so that DRAM may be rapidly flushed before power is lost.

Figure 17:
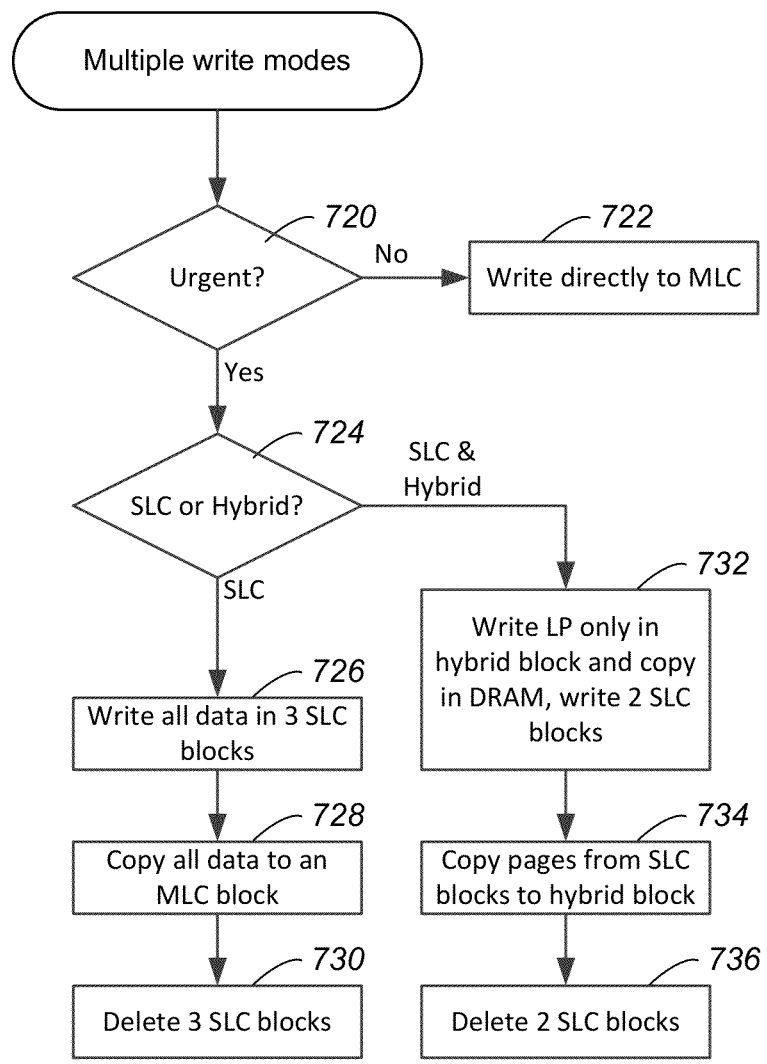
FIG. 17 illustrates different writing modes.

FIG. 17 illustrates how multiple write modes may be used in a nonvolatile memory system. When data is to be written (e.g. because of a new host write command, or some relocation of data such as during garbage collection) a determination is made as to whether it is urgent 720. If the write is not urgent (e.g. if write is part of garbage collection performed when no host command is pending) then the data may be written directly to all pages 722 (e.g. lower, middle, and upper) of one or more MLC blocks. If the write operation is urgent then a determination may be made as to whether the data should be written exclusively in SLC blocks, or in a combination of SLC and hybrid blocks 724. Using exclusively SLC blocks generally provides higher write speed. If exclusively SLC blocks are used then, for a three-bit-per-cell example, three SLC blocks are written 726. The data in the three blocks is then copied into an MLC block as lower, middle, and upper page data in a folding operation 728. Subsequently, the three SLC blocks are deleted 730.

If SLC and hybrid blocks are to be used then data is written in a hybrid block in lower page only format with a copy in DRAM (copying may occur after writing to the hybrid block) 732. Two SLC blocks are also written as before. Subsequently, the data from the SLC blocks is folded into the hybrid block 734 with the DRAM copy providing a backup of the lower page data in the hybrid block in case it becomes unreadable from the hybrid block. Subsequently, the two SLC blocks are deleted 736, thus requiring one less block erase operation than when exclusively SLC blocks were used.

Figure 18:
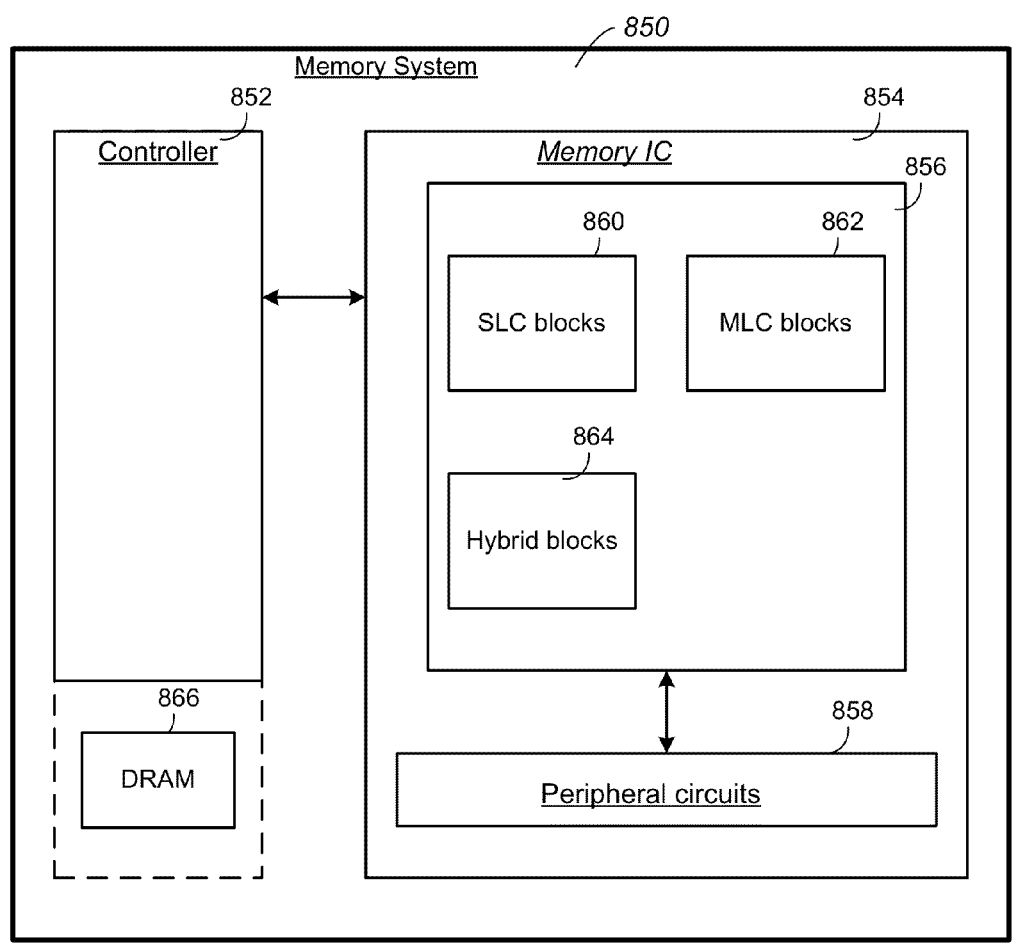
FIG. 18 shows an example of hardware that may be used to implement described aspects.

FIG. 18 shows an example of hardware that may be used to implement aspects of the present invention. A memory system 850 includes a memory controller 852 and a memory IC 854. While a single memory IC is shown, it will be understood that multiple memory ICs may be connected to a memory controller by one or more memory busses. The memory IC 854 includes a memory portion 856 and peripheral circuits 858 (e.g. driver circuitry and control circuitry used in the programming and reading of the memory elements or other such associated circuitry). The memory portion may include memory elements such as flash memory cells arranged in a planar array or a 3D array. The memory cells are configured in blocks, where a block is the unit of erase. The memory portion includes SLC blocks 860 that are configured to store one bit per cell using two possible memory states, MLC blocks 862 that are configured to store two or more bits per cell in four or more memory states, and hybrid blocks 864 that are configured to initially store one bit per cell in two of four or more available memory states and subsequently store additional bits using additional available memory states. It will be understood that these designations are not static and that a given physical block may be an SLC block at one time, an MLC block at another time, and a hybrid block at yet another time. Pools of SLC blocks and hybrid blocks may be maintained that are sufficient to allow host writes to be rapidly executed. The memory system includes DRAM 866 which may be provided on a separate IC, or may be part of the memory controller 852 (which may be formed as an Application Specific Integrated Circuit, or "ASIC", to include circuits required for proper operation of the memory elements and for proper communication with the memory elements). This DRAM may be used to store a backup copy of lower page data in a hybrid block during programming of additional data into such a hybrid block.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a nonvolatile three dimensional memory that is monolithically formed in one or more physical levels of arrays of memory cells having an active area above a silicon substrate, comprising:
    receiving a host command to write a portion of data;
    programming a first logical page of the portion of data one-bit-per-cell in a first physical page of a first block of the nonvolatile three dimensional memory using a lower page Multi Level Cell (MLC) programming scheme;
    programming a second logical page of the portion of data one-bit-per-cell in a second physical page of a second block of the nonvolatile three dimensional memory using a Single Level Cell (SLC) programming scheme;
    programming a third logical page of the portion of data one-bit-per-cell in a third physical page of a third block of the nonvolatile three dimensional memory using the SLC programming scheme;
    subsequently, after execution of the host command, copying the second and the third logical pages of data to the first physical page where they are stored with the first logical page; and
    subsequently, marking the second physical page and the third physical page as obsolete.

2. The method of claim 1 further comprising, maintaining the first logical page of data in a location outside the nonvolatile three dimensional memory throughout the copying of the second and the third logical pages of data to the first physical page.

3. The method of claim 2 wherein the location is in a Dynamic Random Access Memory (DRAM).

4. The method of claim 1 wherein all physical pages of the first block are programmed one-bit-per-cell prior to the copying of the second and third logical pages of data to the first physical page.

5. The method of claim 1 wherein the host command requires that the portion of data is stored within a time limit.

6. The method of claim 1 wherein one or more additional copying steps directed to additional physical pages of the plurality of physical pages of the first block are performed between copying the second logical page of data to the first physical page and copying the third logical page of data to the first physical page.

7. The method of claim 6 further comprising maintaining one-bit-per-cell data from each individual physical page of the plurality of physical pages of the first block in DRAM for a time during which additional bits are copied to cells of the plurality of physical pages.

8. The method of claim 7 further comprising performing foggy programming and subsequently performing fine programming when copying, and maintaining one-bit-per-cell data of an individual physical page until after completion of fine programming of the individual physical page.

9. The method of claim 1 wherein the second and third logical pages are programmed in the first physical page using middle and upper page MLC programming schemes.

10. The method of claim 1 wherein the lower page MLC programming scheme programs memory cells to a first threshold voltage range, the SLC programming scheme programs memory cells to a second threshold voltage range, the second threshold voltage range being higher than the first threshold voltage range.

11. A block-erasable nonvolatile memory system comprising:
    a three dimensional block-erasable memory that is monolithically formed as a plurality of physical levels of arrays of memory cells having an active area disposed above a silicon substrate, the three dimensional memory comprising:
    a plurality of Single Level Cell (SLC) blocks that store one bit per cell;
    a plurality of Multi Level Cell (MLC) blocks that store three or more bits per cell; and
    a plurality of hybrid blocks, an individual hybrid block configured to initially store data using only one bit per cell in at least cells of a first word line, cells of a second word line, and cells of a third word line that are subsequently further programmed with data copied from two or more SLC blocks to store two or more additional bits per cell in the cells of the first, second, and third word lines; and a Random Access Memory (RAM) in communication with the three dimensional block-erasable memory array, the RAM configured to maintain a safe copy of the data that was initially stored in the cells of the first, second, and third word lines during subsequent further programming with the data copied from the two or more SLC blocks.

12. The block-erasable nonvolatile memory system of claim 11 wherein the RAM is a Dynamic Random Access Memory (DRAM) in an integrated circuit that is physically separate from the silicon substrate.

13. The block-erasable nonvolatile memory system of claim 11 wherein the individual hybrid block initially stores one bit per cell in cells of all word lines of the individual hybrid block prior to further programming of any cell of any word line of the individual hybrid block.

14. The block-erasable nonvolatile memory system of claim 11 further comprising a copying circuit in communication with the three dimensional block-erasable memory array, the copying circuit configured to copy data from the two or more SLC blocks to the hybrid block that contains one bit per cell.

15. The block-erasable nonvolatile memory system of claim 11 further comprising programming circuits in communication with the three dimensional block-erasable memory array, the programming circuits configured to program SLC blocks using an SLC programming scheme and to program initial one-bit-per-cell data in hybrid blocks using a lower page MLC programming scheme that is different to the SLC programming scheme.

16. A method of operating a nonvolatile three dimensional memory that is monolithically formed in one or more physical levels of arrays of memory cells having an active area above a silicon substrate, comprising:
    receiving a host write command with data to be stored within a time limit;
    dividing the data of the host write command into at least first, second, and third logical pages;
    programming the first logical page of data one-bit-per-cell in a first physical page of a first block of the nonvolatile three dimensional memory using a lower page Multi Level Cell (MLC) programming scheme;
    programming the second logical page of data one-bit-per-cell in a second physical page of a second block of the nonvolatile three dimensional memory using a Single Level Cell (SLC) programming scheme;
    programming the third logical page of data one-bit-per-cell in a third physical page of a third block of the nonvolatile three dimensional memory using the SLC programming scheme, the programming of the first, second, and third logical pages executed within the time limit;
    subsequently, after all of the data of the host write command is stored, while maintaining a safe copy of the first logical page at a location outside of the nonvolatile three dimensional memory, copying the second and third logical pages of data to the first physical page where they are programmed with the first logical page; and
    subsequently marking the second physical page and the third physical page as obsolete.

17. The method of claim 16 wherein the location is in a Dynamic Random Access Memory (DRAM) integrated circuit that is in communication with the nonvolatile three dimensional memory array.

18. The method of claim 16 wherein the copying is performed only after all physical pages of the first block are programmed with one-bit-per-cell data using the lower page MLC programming scheme.

19. The method of claim 18 wherein the copying is performed only after all physical pages of the second and third blocks are programmed with the SLC programming scheme.

20. A block-erasable nonvolatile memory system comprising:
    a three dimensional block-erasable memory that is monolithically formed as a plurality of physical levels of arrays of memory cells having an active area disposed above a silicon substrate, the three dimensional memory array comprising:
    a plurality of Single Level Cell (SLC) blocks that store one bit per cell;
    a plurality of Multi Level Cell (MLC) blocks that store three or more bits per cell; and
    a plurality of hybrid blocks, an individual hybrid block configured to initially store data using only one bit per cell in at least cells of a first word line, cells of a second word line, and cells of a third word line that are subsequently further programmed with data copied from two or more SLC blocks to store two or more additional bits per cell in the cells of the first, second, and third word lines;
    a Random Access Memory (RAM) in communication with the three dimensional block-erasable memory array, the RAM configured to maintain a safe copy of the data that was initially stored in the cells of the first, second, and third word lines during subsequent further programming with the data copied from the two or more SLC blocks; and
    a memory controller in communication with the three dimensional block-erasable memory array and in communication with a host, the memory controller configured to select a write mode for data to be written in the three dimensional block-erasable memory array from a plurality of write modes that includes a hybrid write mode that initially stores some data of a write command in SLC blocks and stores other data of the write command in at least one hybrid block.

21. The block-erasable nonvolatile memory system of claim 20 wherein the plurality of write modes further includes an SLC write mode that stores all data of a write command in SLC blocks.

22. The block-erasable nonvolatile memory system of claim 21 wherein the plurality of write modes further includes an MLC write mode that stores all data of a write command in one or more MLC blocks without previously storing the data of the write command in SLC blocks.

23. The block-erasable nonvolatile memory system of claim 22 further comprising write circuits configured to program data in SLC blocks using an SLC programming scheme and configured to program one bit per cell in hybrid blocks using an MLC lower page programming scheme that is different to the SLC programming scheme.

* * * * *